(12) United States Patent
Kang et al.

(10) Patent No.: US 8,253,126 B2
(45) Date of Patent: Aug. 28, 2012

(54) ORGANIC ELECTRONIC DEVICE

(75) Inventors: Min Soo Kang, Daejeon (KR); Se Hawn Son, Daejeon (KR); Hyeon Choi, Daejeon (KR)

(73) Assignee: LG Chem. Ltd., Seoul (KR)

( * ) Notice: Subject to any disclaimer, the term of this patent is extended or adjusted under 35 U.S.C. 154(b) by 1393 days.

(21) Appl. No.: 11/589,792

(22) Filed: Oct. 31, 2006

(65) Prior Publication Data

US 2007/0102698 A1 May 10, 2007
US 2010/0117063 A9 May 13, 2010

Related U.S. Application Data

(60) Continuation-in-part of application No. 10/798,584, filed on Mar. 10, 2004, now Pat. No. 7,538,341, which is a division of application No. 09/914,731, filed as application No. PCT/KR00/01537 on Dec. 27, 2000, now Pat. No. 6,720,573.

(30) Foreign Application Priority Data

Dec. 31, 1999 (KR) .............................. 1999-067746
Dec. 26, 2000 (KR) ................................ 2000-82085
Nov. 1, 2005 (KR) ............................. 2005-0103664

(51) Int. Cl.
*H01L 35/24* (2006.01)
(52) U.S. Cl. ................ 257/40; 257/E51.001; 514/235.8
(58) Field of Classification Search .................... 257/40, 257/E51.001; 514/235.8
See application file for complete search history.

(56) References Cited

U.S. PATENT DOCUMENTS

| 3,180,730 A | 4/1965 | Klupfel et al. |
| 3,567,450 A | 3/1971 | Brantly et al. |
| 3,658,520 A | 4/1972 | Brantly et al. |
| 4,356,429 A | 10/1982 | Tang |

(Continued)

FOREIGN PATENT DOCUMENTS

CN 1161002 C 8/2004

(Continued)

OTHER PUBLICATIONS

G. Gu, et al., "Transparent Organic Light Emitting Devices", Applied Physics Letters, vol. 68 (19), p. 2606-2608 (May 1996).

(Continued)

*Primary Examiner* — Anthony Ho
(74) *Attorney, Agent, or Firm* — McKenna Long & Aldridge LLP

(57) ABSTRACT

Disclosed is an electronic device including an n-type organic compound layer as a portion of an electrode for hole injection or hole extraction. The electronic device includes a first electrode including a conductive layer and an n-type organic compound layer disposed on the conductive layer; a second electrode; and a p-type organic compound layer that is interposed between the n-type organic compound layer of the first electrode and the second electrode and forms an NP junction together with the n-type organic compound layer of the first electrode and energy levels of the layers satisfy the following Expressions (1) and (2):

$$2\ eV < E_{nL} - E_{F1} \leq 4\ eV \qquad (1)$$

$$E_{pH} - E_{nL} \leq 1\ eV \qquad (2)$$

where $E_{F1}$ is a Fermi energy level of the conductive layer of the first electrode, $E_{nL}$ is an LUMO energy level of the n-type organic compound layer of the first electrode, and $E_{pH}$ is an HOMO energy level of the p-type organic compound layer forming the NP junction together with the n-type organic compound layer of the first electrode.

24 Claims, 4 Drawing Sheets

U.S. PATENT DOCUMENTS

| | | |
|---|---|---|
| 4,359,507 A | 11/1982 | Gaul et al. |
| 4,720,432 A | 1/1988 | VanSlyke et al. |
| 4,769,292 A | 9/1988 | Tang et al. |
| 4,780,536 A * | 10/1988 | Czarnik et al. .................. 544/225 |
| 4,885,211 A | 12/1989 | Tang et al. |
| 4,885,221 A | 12/1989 | Tsuneeda et al. |
| 5,059,861 A | 10/1991 | Littman et al. |
| 5,059,862 A | 10/1991 | Vanslyke et al. |
| 5,061,569 A | 10/1991 | Vanslyke et al. |
| 5,121,029 A | 6/1992 | Hosokawa et al. |
| 5,141,671 A | 8/1992 | Bryan et al. |
| 5,150,006 A | 9/1992 | VanSlyke et al. |
| 5,151,629 A | 9/1992 | Van Slyke et al. |
| 5,247,190 A | 9/1993 | Friend et al. |
| 5,276,380 A | 1/1994 | Tang |
| 5,283,182 A | 2/1994 | Powell et al. |
| 5,294,810 A | 3/1994 | Egusa et al. |
| 5,294,870 A | 3/1994 | Tang et al. |
| 5,366,811 A | 11/1994 | Higashi et al. |
| 5,405,709 A | 4/1995 | Littman et al. |
| 5,457,565 A | 10/1995 | Namiki et al. |
| 5,484,922 A | 1/1996 | Moore et al. |
| 5,503,910 A | 4/1996 | Matsuura et al. |
| 5,540,999 A | 7/1996 | Yamamoto et al. |
| 5,593,788 A | 1/1997 | Shi et al. |
| 5,608,287 A | 3/1997 | Hung et al. |
| 5,616,427 A | 4/1997 | Tada |
| 5,645,948 A | 7/1997 | Shi et al. |
| 5,677,572 A | 10/1997 | Hung et al. |
| 5,683,823 A | 11/1997 | Shi et al. |
| 5,688,551 A | 11/1997 | Littman et al. |
| 5,703,436 A | 12/1997 | Forrest et al. |
| 5,714,838 A | 2/1998 | Haight et al. |
| 5,739,545 A | 4/1998 | Guha et al. |
| 5,755,999 A | 5/1998 | Shi et al. |
| 5,766,779 A | 6/1998 | Shi et al. |
| 5,776,622 A | 7/1998 | Hung et al. |
| 5,776,623 A | 7/1998 | Hung et al. |
| 5,792,568 A | 8/1998 | Emoto et al. |
| 5,811,833 A | 9/1998 | Thompson |
| 5,837,391 A | 11/1998 | Utsugi |
| 5,840,217 A | 11/1998 | Lupo et al. |
| 5,851,709 A | 12/1998 | Grande et al. |
| 5,917,279 A | 6/1999 | Elschner et al. |
| 5,927,247 A | 7/1999 | Tanaka |
| 5,928,802 A | 7/1999 | Shi et al. |
| 5,932,362 A | 8/1999 | Nagai et al. |
| 5,935,720 A | 8/1999 | Chen et al. |
| 5,935,721 A | 8/1999 | Shi et al. |
| 5,969,474 A | 10/1999 | Arai |
| 5,981,306 A | 11/1999 | Burrows et al. |
| 5,998,803 A | 12/1999 | Forrest et al. |
| 6,020,078 A | 2/2000 | Chen et al. |
| 6,046,543 A | 4/2000 | Bulovic et al. |
| 6,066,357 A | 5/2000 | Tang et al. |
| 6,097,147 A | 8/2000 | Baldo et al. |
| 6,099,750 A | 8/2000 | Simmerer et al. |
| 6,137,223 A | 10/2000 | Hung et al. |
| 6,140,763 A | 10/2000 | Hung et al. |
| 6,172,459 B1 | 1/2001 | Hung et al. |
| 6,208,075 B1 | 3/2001 | Hung et al. |
| 6,226,890 B1 | 5/2001 | Boroson et al. |
| 6,237,529 B1 | 5/2001 | Spahn et al. |
| 6,278,236 B1 | 8/2001 | Madathil et al. |
| 6,284,393 B1 | 9/2001 | Hosokawa et al. |
| 6,312,838 B1 | 11/2001 | Ishibashi et al. |
| 6,351,067 B2 | 2/2002 | Lee et al. |
| 6,352,777 B1 * | 3/2002 | Bulovic et al. ............. 428/411.1 |
| 6,404,126 B1 | 6/2002 | Arai et al. |
| 6,413,656 B1 | 7/2002 | Thompson et al. |
| 6,423,429 B2 | 7/2002 | Kido et al. |
| 6,436,559 B1 | 8/2002 | Ueno et al. |
| 6,451,415 B1 | 9/2002 | Forrest et al. |
| 6,451,455 B1 | 9/2002 | Thompson et al. |
| 6,458,475 B1 | 10/2002 | Adachi et al. |
| 6,465,115 B2 | 10/2002 | Shi et al. |
| 6,475,648 B1 | 11/2002 | Hatwar et al. |
| 6,497,969 B2 | 12/2002 | Kim et al. |
| 6,501,217 B2 | 12/2002 | Beierlein et al. |
| 6,515,298 B2 | 2/2003 | Forrest et al. |
| 6,534,199 B1 | 3/2003 | Hosokawa et al. |
| 6,573,651 B2 | 6/2003 | Adachi et al. |
| 6,602,969 B2 | 8/2003 | Ueda et al. |
| 6,627,333 B2 | 9/2003 | Hatwar |
| 6,656,608 B1 | 12/2003 | Kita et al. |
| 6,661,023 B2 | 12/2003 | Hoag et al. |
| 6,696,177 B1 | 2/2004 | Hatwar |
| 6,713,192 B2 | 3/2004 | Fukuoka et al. |
| 6,717,358 B1 | 4/2004 | Liao et al. |
| 6,720,092 B2 | 4/2004 | Hatwar |
| 6,720,573 B2 * | 4/2004 | Son et al. ..................... 257/40 |
| 6,809,472 B1 | 10/2004 | Carter et al. |
| 6,875,320 B2 | 4/2005 | Raychaudhuri et al. |
| 6,953,947 B2 | 10/2005 | Son et al. |
| 6,963,081 B2 | 11/2005 | Gupta et al. |
| 6,998,487 B2 | 2/2006 | Kim |
| 7,052,351 B2 | 5/2006 | Tutt et al. |
| 7,538,341 B2 | 5/2009 | Son et al. |
| 7,560,175 B2 | 7/2009 | Son et al. |
| 7,648,779 B2 | 1/2010 | Son et al. |
| 7,648,780 B2 | 1/2010 | Son et al. |
| 7,763,882 B2 | 7/2010 | Noh et al. |
| 2002/0011782 A1 | 1/2002 | Lee et al. |
| 2002/0025419 A1 | 2/2002 | Lee et al. |
| 2002/0048687 A1 | 4/2002 | Hosokawa et al. |
| 2002/0100906 A1 | 8/2002 | Takiguchi et al. |
| 2002/0117662 A1 | 8/2002 | Nii |
| 2002/0117962 A1 | 8/2002 | Beierlein et al. |
| 2002/0119297 A1 | 8/2002 | Forrest |
| 2002/0121638 A1 | 9/2002 | Grushin et al. |
| 2002/0127427 A1 | 9/2002 | Young et al. |
| 2002/0158242 A1 | 10/2002 | Son et al. |
| 2002/0186214 A1 | 12/2002 | Siwinski |
| 2002/0197511 A1 | 12/2002 | D Andrade et al. |
| 2003/0012890 A1 | 1/2003 | Weber et al. |
| 2003/0017361 A1 | 1/2003 | Thompson et al. |
| 2003/0040627 A1 | 2/2003 | Fujii |
| 2003/0054198 A1 | 3/2003 | Tsuboyama et al. |
| 2003/0059646 A1 | 3/2003 | Kamatani et al. |
| 2003/0068526 A1 | 4/2003 | Kamatani et al. |
| 2003/0068528 A1 | 4/2003 | Thompson et al. |
| 2003/0068535 A1 | 4/2003 | Takiguchi et al. |
| 2003/0072964 A1 | 4/2003 | Kwong et al. |
| 2003/0072966 A1 | 4/2003 | Hosokawa et al. |
| 2003/0124381 A1 | 7/2003 | Thompson et al. |
| 2003/0141809 A1 | 7/2003 | Furugori et al. |
| 2003/0151356 A1 | 8/2003 | Pichler |
| 2003/0159729 A1 | 8/2003 | Shaheen et al. |
| 2003/0189401 A1 | 10/2003 | Kido et al. |
| 2003/0197465 A1 | 10/2003 | Qiu et al. |
| 2003/0198829 A1 | 10/2003 | Hoag et al. |
| 2003/0203234 A1 | 10/2003 | Shi |
| 2003/0224202 A1 | 12/2003 | Brown et al. |
| 2004/0001969 A1 | 1/2004 | Cosimbescu et al. |
| 2004/0009367 A1 | 1/2004 | Hatwar |
| 2004/0023060 A1 | 2/2004 | Kim et al. |
| 2004/0067387 A1 | 4/2004 | Kim |
| 2004/0113547 A1 | 6/2004 | Son et al. |
| 2004/0169175 A1 | 9/2004 | Son et al. |
| 2004/0214038 A1 | 10/2004 | Kwong et al. |
| 2005/0012465 A1 | 1/2005 | Uchida |
| 2005/0038296 A1 | 2/2005 | Hosokawa et al. |
| 2005/0040390 A1 | 2/2005 | Pfeiffer et al. |
| 2005/0189875 A1 | 9/2005 | Nakada |
| 2005/0211977 A1 | 9/2005 | Hirai et al. |
| 2005/0212072 A1 | 9/2005 | Lee et al. |
| 2005/0255334 A1 | 11/2005 | Kang et al. |
| 2005/0260442 A1 | 11/2005 | Yu et al. |
| 2006/0038484 A1 | 2/2006 | Noh et al. |
| 2006/0057750 A1 | 3/2006 | Aoki et al. |
| 2006/0232992 A1 | 10/2006 | Bertram et al. |
| 2006/0240280 A1 | 10/2006 | Liao et al. |
| 2006/0240281 A1 | 10/2006 | Liao et al. |
| 2007/0102698 A1 | 5/2007 | Kang et al. |
| 2007/0257605 A1 | 11/2007 | Son et al. |
| 2008/0001532 A1 | 1/2008 | Son et al. |
| 2008/0138962 A1 | 6/2008 | Sato et al. |

| | | | |
|---|---|---|---|
| 2008/0284325 | A1 | 11/2008 | Noh et al. |
| 2009/0009101 | A1 | 1/2009 | Kang et al. |
| 2009/0058260 | A9 | 3/2009 | Noh et al. |

FOREIGN PATENT DOCUMENTS

| | | |
|---|---|---|
| EP | 0 390 551 | 10/1990 |
| EP | 0 732 868 | 9/1996 |
| EP | 0 797 375 A2 | 9/1997 |
| EP | 0 891 121 | 1/1999 |
| EP | 1 029 909 | 8/2000 |
| EP | 1 076 368 | 2/2001 |
| EP | 1 099 744 A2 | 5/2001 |
| EP | 1 179 862 A2 | 2/2002 |
| EP | 1 182 244 | 2/2002 |
| EP | 1 187 235 | 3/2002 |
| EP | 1 221 719 | 7/2002 |
| EP | 1 238 981 | 9/2002 |
| EP | 1 239 526 | 9/2002 |
| EP | 1 244 155 | 9/2002 |
| EP | 1 571 709 | 9/2005 |
| EP | 1727396 A1 | 11/2006 |
| GB | 2 400 979 | 10/2004 |
| JP | 06-163158 A | 6/1994 |
| JP | 07-11249 | 1/1995 |
| JP | 07-109449 | 4/1995 |
| JP | 07-157473 | 6/1995 |
| JP | 08-167477 A | 6/1996 |
| JP | 09-148071 | 6/1997 |
| JP | 2000-223276 | 8/2000 |
| JP | 2000-223276 A | 8/2000 |
| JP | 2001-110571 | 4/2001 |
| JP | 2002-246184 | 8/2002 |
| JP | 2002-246184 A | 8/2002 |
| JP | 2003-501795 | 1/2003 |
| JP | 2003-059667 | 2/2003 |
| JP | 2003-073387 | 3/2003 |
| JP | 2003-073388 | 3/2003 |
| JP | 2003-073665 | 3/2003 |
| JP | 2003146951 | 5/2003 |
| JP | 2005-167175 | 6/2003 |
| JP | 2005-167175 A | 6/2003 |
| JP | 2004-95850 | 3/2004 |
| JP | 2004091334 | 3/2004 |
| JP | 2005-003901 | 1/2005 |
| JP | 2005-004062 | 1/2005 |
| JP | 2005-167175 | 6/2005 |
| JP | 2005-251398 | 9/2005 |
| JP | 2007-502534 | 2/2007 |
| JP | 2007-518220 | 7/2007 |
| KR | 10-2000/0082085 | 12/2000 |
| KR | 2000-82085 | 12/2000 |
| KR | 10-2003/0067773 A | 8/2003 |
| KR | 1020030067773 A | 8/2003 |
| KR | 1020010062711 | 6/2005 |
| TW | 506229 | 10/2002 |
| WO | WO 98/49163 A | 11/1998 |
| WO | WO 9849163 A1 * | 11/1998 |
| WO | WO 98/55561 | 12/1998 |
| WO | WO 99/39393 A1 | 8/1999 |
| WO | WO 00/18851 | 4/2000 |
| WO | WO 00/57676 | 9/2000 |
| WO | WO 00/70655 | 11/2000 |
| WO | WO 01/06576 A1 | 1/2001 |
| WO | WO 01/39234 | 5/2001 |
| WO | WO 01/41512 | 6/2001 |
| WO | WO 01/49806 A1 | 7/2001 |
| WO | WO 01/93642 | 12/2001 |
| WO | WO 02/15645 | 2/2002 |
| WO | WO 02/071813 | 9/2002 |
| WO | WO 02/074015 | 9/2002 |
| WO | WO 03/012890 A2 | 2/2003 |
| WO | WO 03/060956 | 7/2003 |
| WO | WO 03/083958 | 10/2003 |
| WO | WO 2004/018587 | 3/2004 |
| WO | WO 2004/054326 | 6/2004 |
| WO | WO 2005/015640 | 2/2005 |
| WO | PCT/KR 2005/001381 | 5/2005 |
| WO | WO 2005/109542 | 11/2005 |
| WO | WO 2005/109542 A1 | 11/2005 |
| WO | WO 2006/008829 | 1/2006 |
| WO | WO 2006/019270 A1 | 2/2006 |
| WO | WO 2006/075822 A1 | 7/2006 |
| WO | WO 2007/011132 | 1/2007 |

OTHER PUBLICATIONS

G. Parthasarathy, et al. "A Metal-Free Cathode for Organic Semiconductor Devices" Applied Physics Letters, vol. 72, (17), pp. 2138-2140 (Apr. 1998).

L. S. Hung, et al. "Interface Engineering in Preparation of Organic Surface-Emitting Diodes", Applied Physics Letters, vol. 74 (21), pp. 3209-3211 (May 1999).

Chieh-Wei Chen, et al. "An Effective Cathode Structure for Inverted Top-Emitting Organic Light-Emitting Devices", Applied Physics Letters, vol. 85 (13), pp. 2469-2471 (Sep. 2004).

Jie Liu, et al. "Efficient Bottom Cathodes for Organic Light-Emitting Devices", Applied Physics Letters, vol. 85 (5), pp. 837-839 (Aug. 2004).

Chang et al., "Dual-color polymer light-emitting pixels processed by hybrid inkjet printing", Applied Physics Letters, 73 (18), pp. 2561-2563 (Nov. 1998).

Birnstock et al., "Screen-printed passive matrix displays based on light-emitting polymers", Applied Physics Letters, vol. 78, (24), pp. 3905-3907 (Jun. 2001).

J. Cui et al., "Indium Tin Oxide Alternatives—High Work Function Transparent Conducting Oxides As Anodes for Organic Light-Emitting Diodes", pp. 1476-1480, Advanced Materials, 2001, 13, No. 19, (Oct. 2001).

Adachi et al, Electroluminescence in Organic Films with Three-Layer Structure, Japanese Journal of App. Physics, 27, L269 (1988).

Tang et al, Electroluminescence of Doped Organic Thin Films, Jour. of Appl. Phys. 65, 3610 (1989).

Mason et al, Characterization of treated indium-tin-oxide surfaces used in electroluminescent devices, Jour. Appl. Phys. 86(3) 1688 (1999).

Zhou et al. "Low-voltage inverted transparent vacuum deposited organic light-emitting diodes using electrical doping", Applied Physics Letters, vol. 81, No. 5, Jul. 29, 2002, p. 992-924.

Kim, J.S. et al., "Indium-tin oxide treatmenst for single-and double-layer polymeric light-emitting diodes: The relation between the anode physical, chemical, and morphological properties and the device performance", Journ. of Applied Physics, vol. 84, No. 12, pp. 6859-6870 (Dec. 1998).

Kruger, Jessica et al., "Modification of $TiO_2$ Heterojunctions with Benzoic Acid Derivatives in Hybrid Molecular Solid-State Devices," Advanced Materials, vol. 12, pp. 447-451 (2000).

Perterse, Koen et al., "Towards Organic N-Type Semi-Conducting Materials", Polymer preprint, 40, pp. 404-405 (1999).

* cited by examiner

[Figure 1]
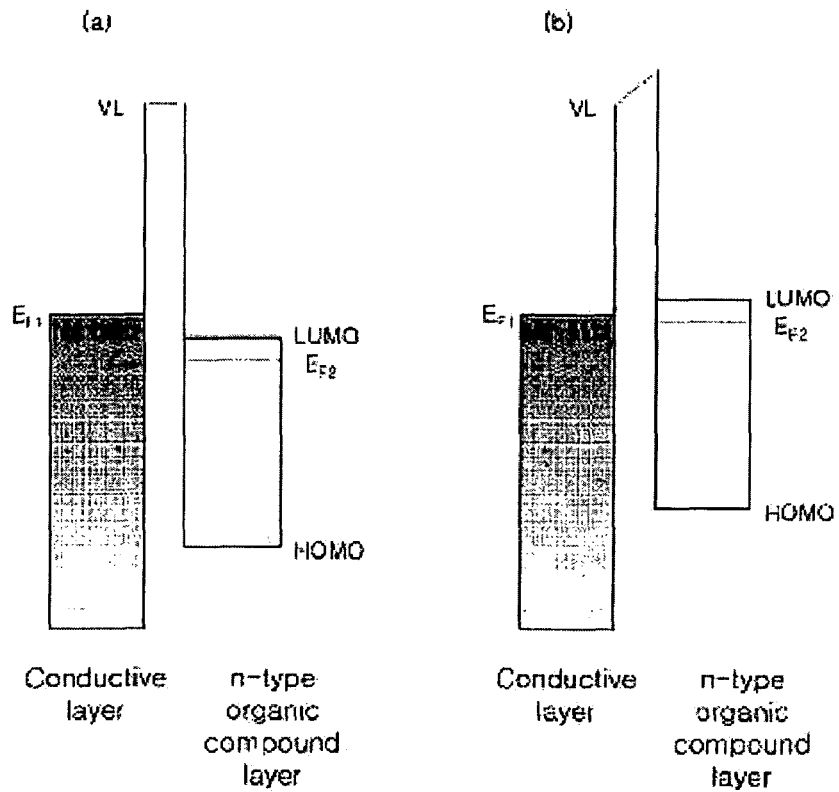
[Figure 2]
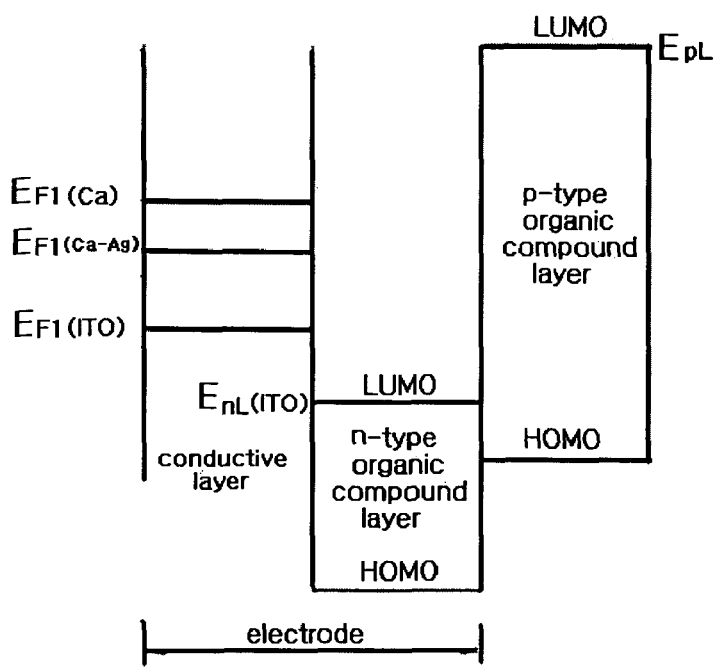

[Figure 3]
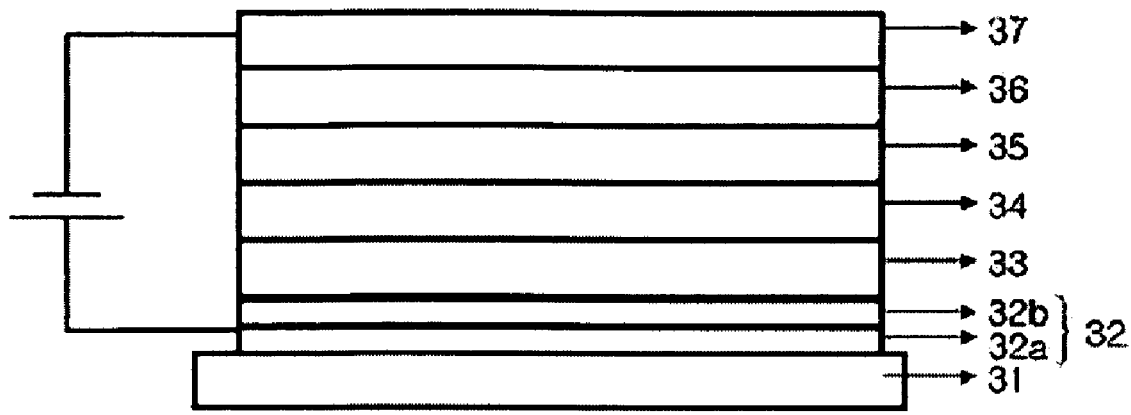
[Figure 4]
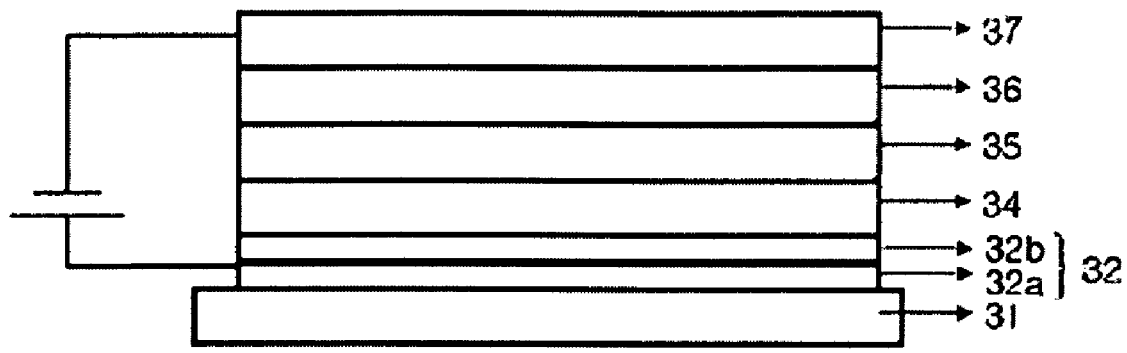
[Figure 5]
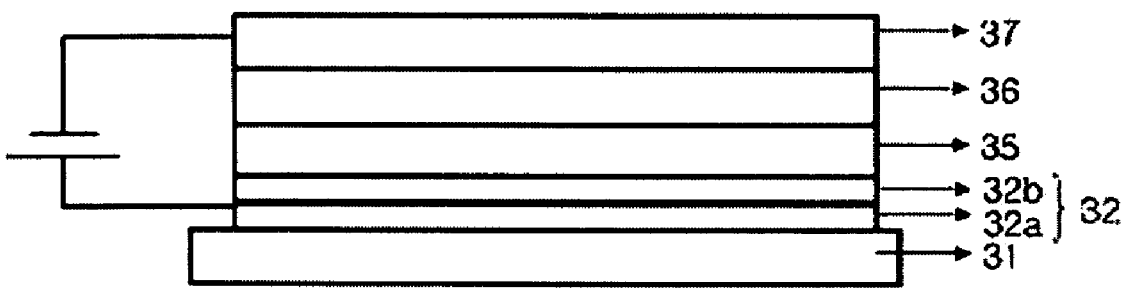

【Figure 6】
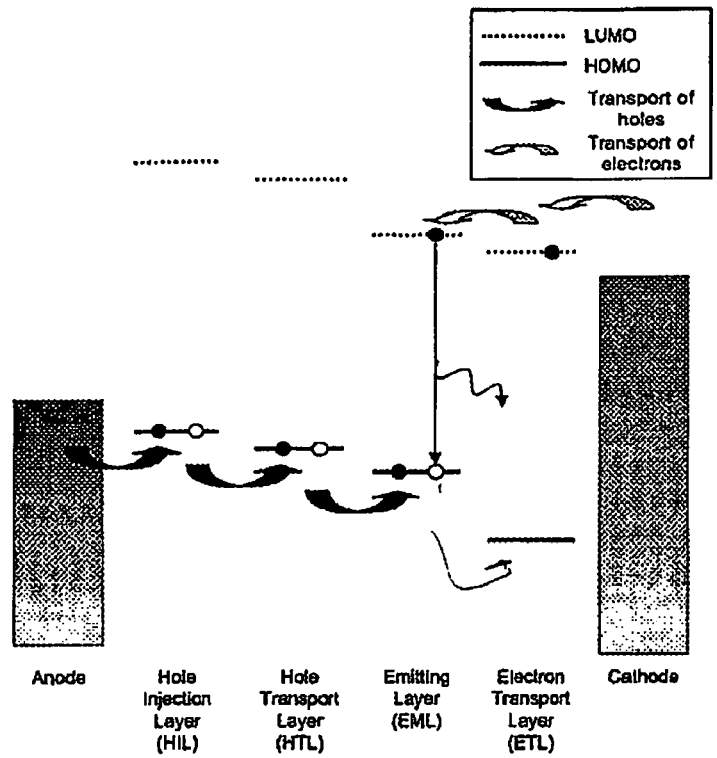
【Figure 7】
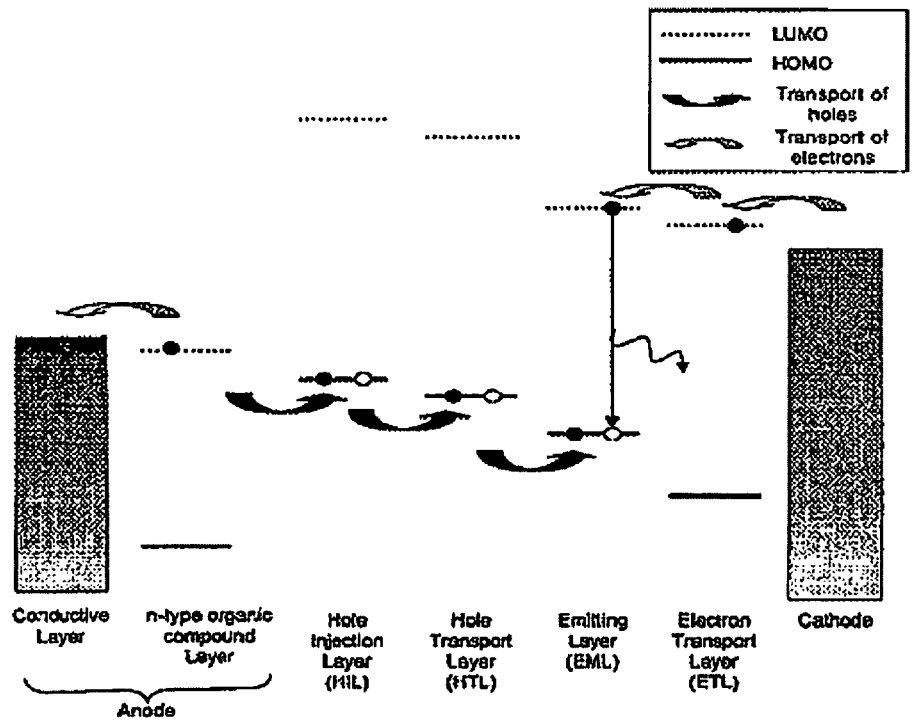

[Figure 8]
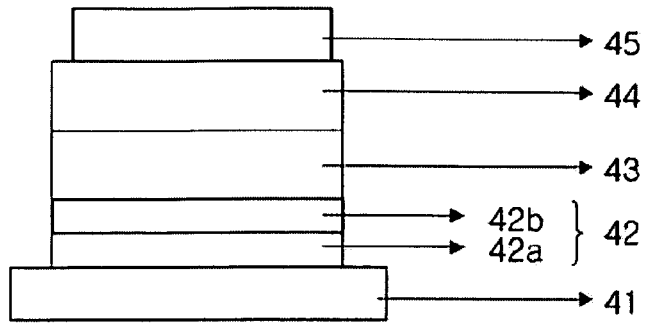
[Figure 9]
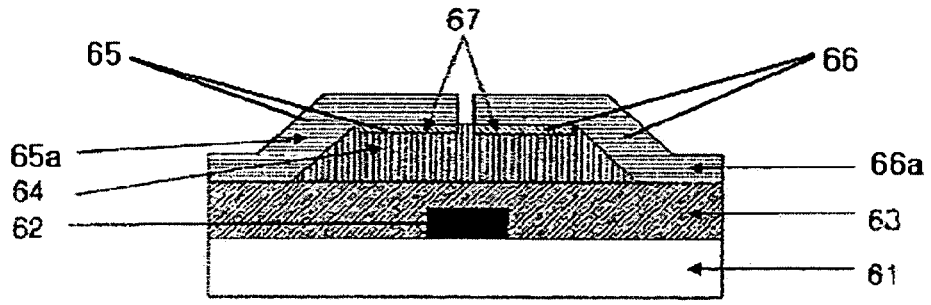
[Figure 10]
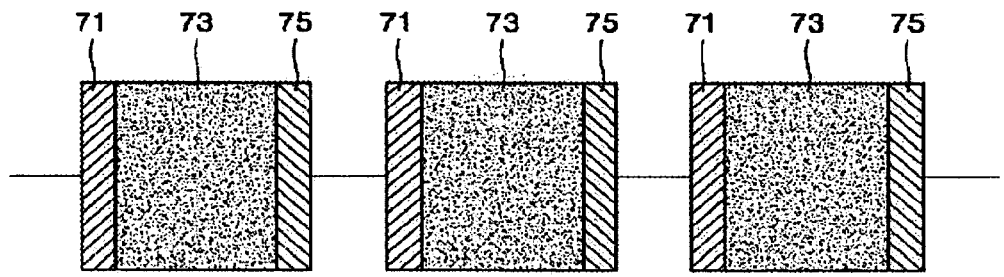
[Figure 11]
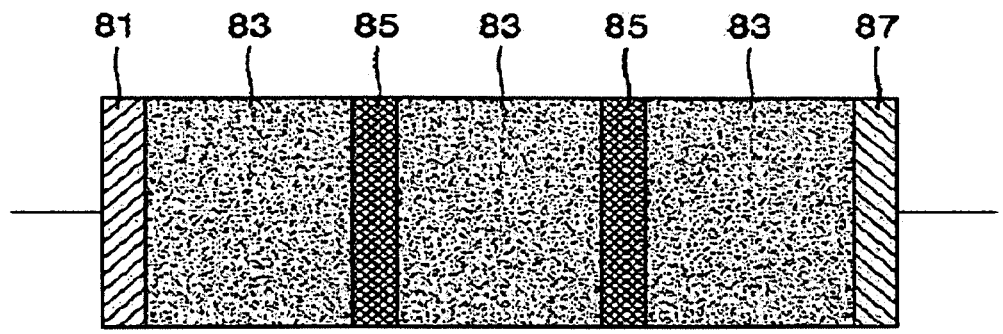

US 8,253,126 B2

ORGANIC ELECTRONIC DEVICE

This application claims foreign priority based on Korean Patent Application No. 2005-0103664, filed Nov. 1, 2005, this application is also a continuation-in-part of U.S. application Ser. No. 10/798,584, filed on Mar. 10, 2004, which is a divisional application of U.S. application Ser. No. 09/914,731, filed Aug. 30, 2001, now U.S. Pat. No. 6,720,573, which is a national stage application of International Patent Application PCT/KR00/01537 that claims priority to Korean Patent Application No. 2000-82085, filed Dec. 26, 2000, and of Korean Patent Application No 1999-067746, filed Dec. 31, 1999

TECHNICAL FIELD

The present invention relates to an electronic device in which an electrode for hole injection or hole extraction has an n-type organic compound layer. More specifically, the present invention relates to an electronic device capable of reducing an energy barrier for hole injection or hole extraction.

This application claims priority benefits from Korean Patent Application No. 10-2005-0103664, filed on Nov. 1, 2005, the entire contents of which are fully incorporated herein by reference.

BACKGROUND ART

In general, an electronic device, such as a solar cell, an organic light emitting device, or an organic transistor, includes two electrodes and an organic compound layer interposed therebetween. For example, a solar cell generates electricity using electrons and holes separated from exitons that are generated in an organic compound layer by solar energy. An organic light emitting device converts a current into visible light by injecting electrons and holes from two electrodes into an organic compound layer. An organic transistor transports holes or electrons generated in an organic compound layer between a source electrode and a drain electrode by applying a voltage to a gate electrode. The electronic device may further include an electron/hole injection layer, an electron/hole extraction layer, or an electron/hole transport layer.

However, since the interfaces between the organic compound layer and the electrodes each containing a metal, a metal oxide, or a conductive polymer are unstable, heat from the outside, heat generated inside, or an electric field applied to the electronic device may have a bad effect on performance of the electronic device. Further, due to a conductive energy level difference between the organic compound layer and the electron/hole injection layer, the electron/hole extraction layer, or the electron/hole transport layer, a driving voltage for driving the electronic device may increase. Therefore, it is important not only to minimize the energy barrier for hole/electron injection to the electrodes and hole/electron extraction from the electrodes, but also to stabilize the interfaces between the organic compound layer and the electrodes and the interfaces between the organic compound and the electron/hole injection layer, the electron/hole extraction layer, and the electron/hole transport layer.

Electronic devices capable of adjusting the energy level differences between the electrodes and the organic compound layer interposed therebetween have been developed. In case of an organic light emitting device, in order to smoothly inject holes, an anode is adjusted to have a Fermi energy level similar to an HOMO (highest occupied molecular orbital) energy level of a hole injection layer or a material having an HOMO energy level similar to a Fermi energy level of an anode is selected as a material for a hole injection layer. However, since the hole injection layer should be selected in view of an HOMO energy level of a hole transport layer or an emitting layer close to the hole injection layer as well as in view of the Fermi energy level of the anode, there is a limitation to select a material for the hole injection layer.

For this reason, in general, a method of adjusting a Fermi energy level of an anode is used to manufacture an organic light emitting device. However, in such a method, a material for the anode is limited. In an organic transistor, gold or precious metals are used as materials of a source electrode and a drain electrode. However, precious metals, such as gold, are very expensive and are not easily processed compared with other metals. Therefore, the manufacturing process of the organic transistor is complicated and thus it is difficult to commercially use the organic transistor.

DISCLOSURE

Technical Problem

Accordingly, it is an object of the present invention to provide an electronic device, such as an organic light emitting device, an organic solar cell and an organic transistor, which includes a first electrode, a second electrode, and an organic compound layer interposed between the first and second electrodes, in which the first electrode and the second electrode are formed of the same material, and a stack-type organic light emitting device using the organic light emitting device as a repetition unit.

It is another object of the present invention to provide an electronic device, such as an organic light emitting device, an organic solar cell, and an organic transistor, in which, in a case where a first electrode includes an n-type organic compound layer and a conductive layer, even though an energy difference between an LUMO (Lowest Unoccupied Molecular Orbital) energy level of the n-type organic compound layer of the first electrode and a Fermi energy level of the conductive layer of the first electrode is large, for example, 2 eV to 4 eV, hole injection and/or hole extraction capacity can be improved with a low electrical barrier for hole injection and/or hole extraction at an interface between an electrode and an organic compound layer, whereby excellent device performance exhibits, and in which an electrode can be formed of various materials, whereby a device manufacturing process can be simplified.

Technical Solution

According to an exemplary embodiment of the invention, an electronic device includes a first electrode including a conductive layer and an n-type organic compound layer disposed on the conductive layer; a second electrode; and a p-type organic compound layer that is interposed between the n-type organic compound layer of the first electrode and the second electrode and forms an NP junction together with the n-type organic compound layer of the first electrode. Energy levels of the layers satisfy the following Expressions (1) and (2):

$$2 \text{ eV} < E_{nL} - E_{F1} \leq 4 \text{ eV} \tag{1}$$

$$E_{pH} - E_{nL} \leq 1 \text{ eV} \tag{2}$$

where $E_{F1}$ is a Fermi energy level of the conductive layer of the first electrode, $E_{nL}$ is an LUMO energy level of the n-type organic compound layer of the first electrode, and $E_{pH}$ is an HOMO energy level of the p-type organic compound layer forming the NP junction together with the n-type organic compound layer of the first electrode.

According to another exemplary embodiment of the invention, an organic light emitting device includes an anode including a conductive layer and an n-type organic compound layer disposed on the conductive layer; a cathode; and a p-type organic compound layer that is interposed between the n-type organic compound layer of the anode and the cathode and forms an NP junction together with the n-type organic compound layer of the anode. Energy levels of the layers satisfy the following Expressions (3) and (4):

$$2 \text{ eV} < E_{nL} - E_{F1} \leq 4 \text{ eV} \qquad (3)$$

$$E_{pH} - E_{nL} \leq 1 \text{ eV} \qquad (4)$$

where $E_{F1}$ is a Fermi energy level of the conductive layer of the anode, $E_{nL}$ is an LUMO energy level of the n-type organic compound layer of the anode, and $E_{pH}$ is an HOMO energy level of the p-type organic compound layer forming the NP junction together with the n-type organic compound layer of the anode.

According to another exemplary embodiment of the invention, an organic solar cell includes an anode including a conductive layer and an n-type organic compound layer disposed on the conductive layer; a cathode; and an electron donor layer consisting of a p-type organic compound layer that is interposed between the n-type organic compound layer of the anode and the cathode and forms an NP junction together with the n-type organic compound layer of the anode. Energy levels of the layers satisfy the following Expressions (5) and (6):

$$2 \text{ eV} < E_{nL} - E_{F1} \leq 4 \text{ eV} \qquad (5)$$

$$E_{pH} - E_{nL} \leq 1 \text{ eV} \qquad (6)$$

where $E_{F1}$ is a Fermi energy level of the conductive layer of the anode, $E_{nL}$ is an LUMO energy level of the n-type organic compound layer of the anode, and $E_{pH}$ is an HOMO energy level of the p-type organic compound layer forming the NP junction together with the n-type organic compound layer of the anode.

According to another exemplary embodiment of the invention, an organic transistor includes a source electrode; a drain electrode; a gate electrode; an insulating layer disposed on the gate electrode; and a p-type organic compound layer disposed on the insulating layer. At least one of the source electrode and the drain electrode includes a conductive layer and an n-type organic compound layer forming an NP junction together with the p-type organic compound layer, and energy levels of the layers satisfy the following Expressions (7) and (8):

$$2 \text{ eV} < E_{nL} - E_{F1} \leq 4 \text{ eV} \qquad (7)$$

$$E_{pH} - E_{nL} \leq 1 \text{ eV} \qquad (8)$$

where $E_{F1}$ is a Fermi energy level of the conductive layer of the source electrode or drain electrode, $E_{nL}$ is an LUMO energy level of the n-type organic compound layer of the source electrode or drain electrode, and $E_{pH}$ is an HOMO energy level of the p-type organic compound layer forming the NP junction together with the n-type organic compound layer of the source electrode or drain electrode.

Advantageous Effects

As described above, in an electronic device, such as an organic light emitting device, a stack-type light emitting device, an organic transistor, and an organic solar cell, according to the invention, a conductive layer of a first electrode and a second electrode may be formed of the same material. Therefore, it is possible to obtain a high-luminance organic light emitting device having a stacked structure and to realize various devices, such as a stack-type electronic device in which a plurality of unit electronic devices are stacked. Further, it is possible to use various electrode materials in an electronic device, such as an organic light emitting device, an organic transistor, and an organic solar cell, requiring hole injection and hole extraction layers, and to simplify the manufacturing process.

Furthermore, since an organic electronic device according to the invention lowers an electrical barrier for hole injection or hole extraction and forms an NP junction of an n-type organic compound layer and a p-type organic compound layer, the efficiency of the device is high. In addition, since various materials can be used to form an electrode, it is possible to further simplify the manufacturing process.

DESCRIPTION OF DRAWINGS

FIGS. 1(a) and 1(b) are views illustrating energy levels of a first electrode for hole injection or hole extraction before and after applying an n-type organic compound layer to the first electrode in an electronic device according to an exemplary embodiment of the invention, respectively.

FIG. 2 is a view illustrating an NP junction formed between an n-type organic compound layer of a first electrode for hole injection or hole extraction and a p-type organic compound layer in an electronic device according to an exemplary embodiment of the invention.

FIGS. 3 to 5 are cross-sectional views schematically illustrating organic light emitting devices according to exemplary embodiments of the invention;

FIG. 6 is a view illustrating an ideal energy level of a conventional organic light emitting device.

FIG. 7 is a view illustrating an energy level of an organic light emitting device according to an exemplary embodiment of the invention.

FIG. 8 is a cross-sectional view schematically illustrating an organic solar cell according to an exemplary embodiment of the invention.

FIG. 9 is a cross-sectional view schematically illustrating an organic transistor according to an exemplary embodiment of the invention.

FIGS. 10 and 11 are cross-sectional views schematically illustrating stack-type organic light emitting devices according to exemplary embodiments of the invention.

REFERENCE NUMERALS 31, 41, 61: SUBSTRATE
32, 42: ANODE
37, 45: CATHODE
33: HOLE INJECTION LAYER
34: HOLE TRANSPORT LAYER
35: EMITTING LAYER
36: ELECTRON TRANSPORT LAYER
43: ELECTRON DONER LAYER
44: ELECTRON ACCEPTOR LAYER
62: GATE ELECTRODE
63: INSULATING LAYER
64: p-TYPE ORGANIC COMPOUND LAYER
65: SOURCE ELECTRODE
66: DRAIN ELECTRODE 32a, 42a, 65a, 66a: CONDUCTIVE LAYER
32b, 42b, 67: n-TYPE ORGANIC COMPOUND LAYER

BEST MODE

Hereinafter, only preferred embodiments of the invention will be illustrated and described by explaining conditions contrived by the inventors in order to implement the present invention. However, various changes or modifications can be made without departing from the scope of the present invention. The accompanying drawings and the following detailed description are illustrative but not intended to limit the invention.

An electronic device according to an exemplary embodiment of the invention includes a first electrode including a conductive layer and an organic compound layer that is formed on the conductive layer and has n-type semiconductor features (hereinafter, referred to as an "n-type organic compound layer"), a second electrode, and an organic compound layer having p-type semiconductor features for forming an NP junction together with the n-type organic compound layer of the first electrode (hereinafter, referred to as a "p-type organic compound layer"). The electronic device may further include at least one selected from an electron/hole injection layer, an electron/hole extraction layer, an electron/hole transport layer, and an emitting layer, which is disposed between the p-type organic compound layer and the second electrode.

The conductive layer of the first electrode may be formed of a metal, a metal oxide, or a conductive polymer. The conductive polymer may include an electro-conductive polymer. The n-type organic compound layer formed on the conductive layer of the first electrode has a predetermined LUMO energy level with respect to a Fermi energy level of the conductive layer and an HOMO energy level of the p-type organic compound layer. The n-type organic compound layer of the first electrode is selected so as to reduce an energy difference between the LUMO energy level of the n-type organic compound layer of the first electrode and the Fermi energy level of the conductive layer of the first electrode and an energy difference between the LUMO energy level of the n-type organic compound layer of the first electrode and the HOMO energy level of the p-type organic compound layer. Therefore, holes are easily injected into the HOMO energy level of the p-type organic compound layer through the LUMO energy level of the n-type organic compound layer of the first electrode. Also, holes are easily extracted from the HOMO energy level of the p-type organic compound layer through the LUMO energy level of the n-type organic compound layer of the first electrode. However, in the invention, the energy difference between the LUMO energy level of the n-type organic compound layer of the first electrode and the Fermi energy level of the conductive layer of the first electrode is equal to or more than a predetermined value such that the conductive layer of the first electrode is formed of a material having a low work function. Specifically, in the invention, various materials can be used to form the electrode. The detailed description thereof will be described below.

International Application No. PCT/KR2005/001381 in the name of the inventors discloses an electrode device that includes a first electrode including a conductive layer and an n-type organic compound layer disposed on the conductive layer; a second electrode; and a p-type organic compound layer that is interposed between the n-type organic compound layer of the first electrode and the second electrode and forms an NP junction together with the n-type organic compound layer, wherein a difference between an LUMO energy level of the n-type organic compound layer of the first electrode and a Fermi energy level of the conductive layer of the first electrode is 2 eV or less, and a difference between the LUMO energy level of the n-type organic compound layer of the first electrode and an HOMO energy level of the p-type organic compound layer is 1 eV or less. In the electronic device according to the above-mentioned application, hole injection and/or hole extraction capacity can be improved with a low energy barrier for hole injection and/or hole extraction at an interface between the first electrode and the organic compound layer, whereby excellent device performance exhibits, and an electrode can be formed of various materials, whereby a device manufacturing process can be simplified.

When the conductive layer of the first electrode and the second electrode are formed of the same material, it is possible to realize various devices, such as a stack-type electronic device in which unit electronic devices are stacked and to simplify a device manufacturing process. Nevertheless, in the electronic device according to the above-mentioned application, in case of the second electrode, unlike the first electrode, it is advantageous to use a material having a low work function such that electrons are easily injected thereto. For example, LiF—Al, Li—Al, Ca, Ca—Ag, or Ca-IZO is used as the material of the second electrode. Therefore, in a case where the first electrode should satisfy the above-mentioned condition that the difference between the LUMO energy level of the n-type organic compound layer of the first electrode and the Fermi energy level of the conductive layer of the first electrode is 2 eV or less, there is a limitation to apply Ca, Ca—Ag, or Ca-IZO among the above-mentioned examples of the material of the second electrode to the conductive layer of the first electrode.

According to this invention, the energy difference between the LUMO energy level of the n-type organic compound layer of the first electrode and the Fermi energy level of the conductive layer of the first electrode is more than 2 eV and equal to or less than 4 eV. Further, the energy difference between the LUMO energy level of the n-type organic compound layer of the first electrode and the HOMO energy level of the p-type organic compound layer is 1 eV or less, and preferably, approximately 0.5 eV or less. This energy difference is preferably approximately 0.01 eV to 1 eV in view of material selection.

When the energy difference between the LUMO energy level of the n-type organic compound layer of the first electrode and the Fermi energy level of the conductive layer of the first electrode is more than 4 eV, an effect of a surface dipole or a gap state on an energy barrier for hole injection or hole extraction is reduced. When the energy difference between the LUMO energy level of the n-type organic compound layer of the first electrode and the Fermi energy level of the conductive layer of the first electrode is equal to or less than 2 eV, there is a limitation in the selection of materials for the conductive layer of the first electrode. Also, when the energy difference between the LUMO energy level of the n-type organic compound layer of the first electrode and the HOMO energy level of the p-type organic compound layer is more than approximately 1 eV, the NP junction of the p-type organic compound layer and the n-type organic compound layer of the first electrode is not easily formed and thus a driving voltage for hole injection or hole extraction increases.

FIGS. 1(a) and 1(b) illustrate energy levels of a first electrode for hole injection or hole extraction before and after an n-type organic compound layer is applied to the first electrode in an electronic device according to an exemplary embodiment of the invention, respectively. In FIG. 1(a), the conductive layer of the first electrode has a Fermi energy level $E_{F1}$ lower than a Fermi energy level $E_{F2}$ of the n-type organic compound layer. A vacuum level (VL) represents an energy level at which electrons can freely move in the conductive layer and the n-type organic compound layer.

In a case where the electronic device uses the n-type organic compound layer as a portion of the first electrode, the conductive layer is brought into contact with the n-type organic compound layer. In FIG. 1(b), since electrons move from the conductive layer to the n-type organic compound layer, the Fermi energy levels $E_{F1}$ and $E_{F2}$ of both layers come to be the same. As a result, a surface dipole is formed at the interface of the conductive layer and the n-type organic compound layer, and the vacuum level, the Fermi energy level, the HOMO energy level, and the LUMO energy level are changed as shown in FIG. 1(b).

Therefore, even though the energy difference between the Fermi energy level of the conductive layer of the first electrode and the LUMO energy level of the n-type organic compound layer of the first electrode is large, the energy barrier for hole injection or hole extraction can be reduced by bringing the conductive layer into contact with the n-type organic compound layer. Further, when the conductive layer has a Fermi energy level lower than the LUMO energy level of the n-type organic compound layer, electrons move from the conductive layer to the n-type organic compound layer, and thus a gap state is formed at an interface between the conductive layer and the n-type organic compound layer. As a result, the energy barrier for electron transport is minimized.

The n-type organic compound layer formed on the conductive layer of the first electrode may contain a compound represented by the following Formula 1.

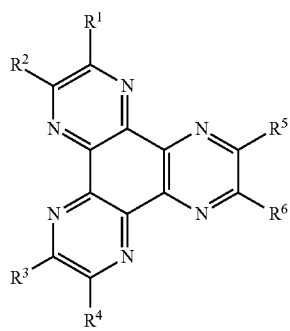

[Formula 1]

In Formula 1, each of $R^1$ to $R^6$ is selected from a group consisting of hydrogen, halogen atoms, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight or branched chain $C_1$-$C_{12}$ alkoxy, substituted or unsubstituted straight or branched $C_1$-$C_{12}$ alkyl, substituted or unsubstituted aromatic or non-aromatic heterocyclic rings, substituted or unsubstituted aryl, substituted or unsubstituted mono- or di-arylamine, and substituted or unsubstituted aralkylamine, and each of R and R' are selected from a group consisting of substituted or unsubstituted $C_1$-$C_{60}$ alkyl, substituted or unsubstituted aryl, and substituted or unsubstituted 5-7 membered heterocyclic rings.

Examples of the compound of Formula 1 may include compounds represented by the following Formulae 1-1 to 1-6.

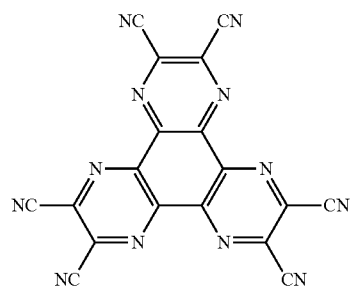

[Formula 1-1]

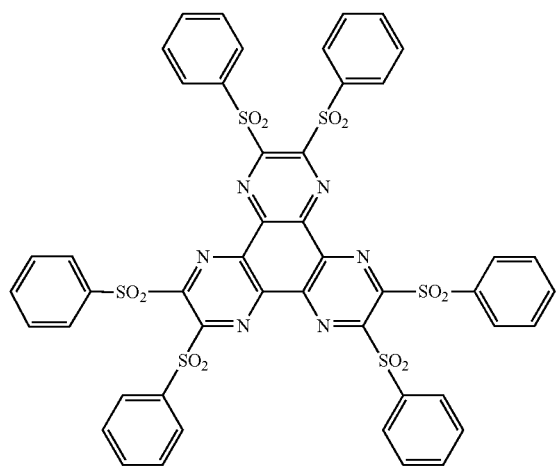

[Formula 1-2]

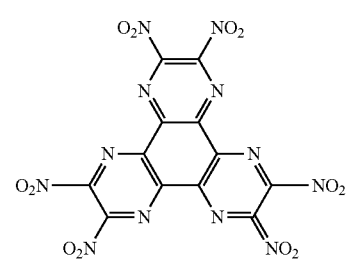

[Formula 1-3]

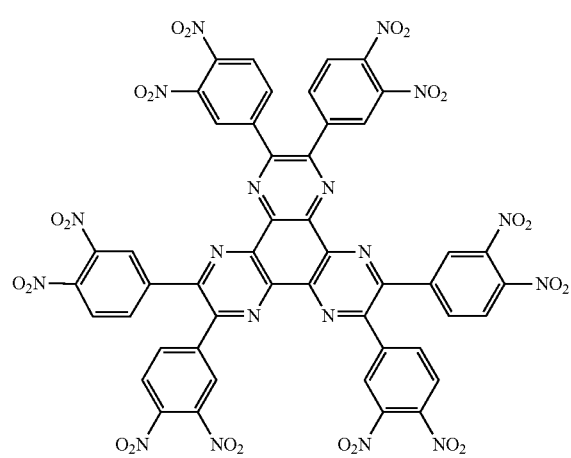

[Formula 1-4]

-continued

[Formula 1-5]

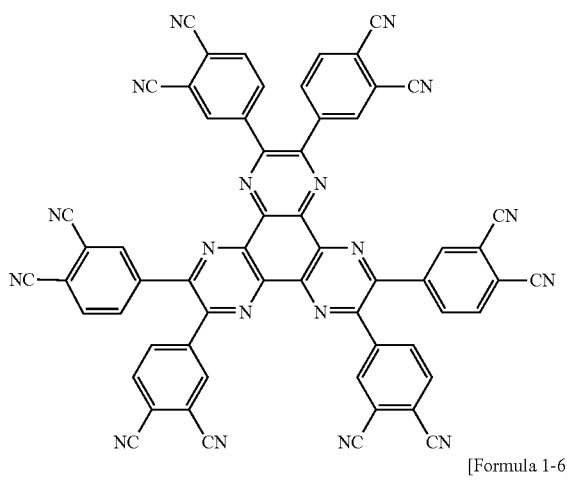

[Formula 1-6]

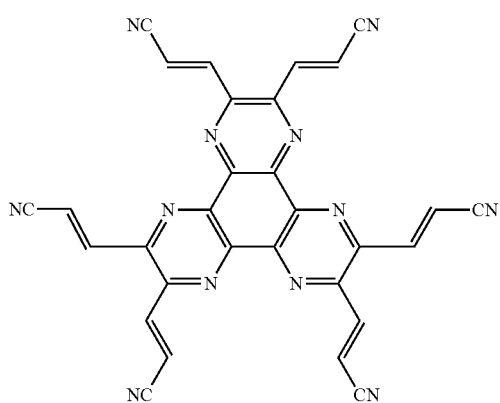

Other examples, synthesizing methods, and various features of Formula 1 are disclosed in US Patent Application No. 2002-0158242 and U.S. Pat. Nos. 6,436,559 and 4,780,536, and the contents of the above-mentioned documents are incorporated herein.

Further, the n-type organic compound layer may contain at least one compound selected from 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted 3,4,9,10-perylenetetracarboxylic dianhydride (PTCDA), naphthalene-tetracaboxylic-dianhydride (NTCDA), fluoro-substituted naphthalene-tetracaboxylic-dianhydride (NTCDA), or cyano-substituted naphthalene-tetracaboxylic-dianhydride (NTCDA).

The electronic device according to the exemplary embodiment of the invention includes the p-type organic compound layer being in contact with the n-type organic compound layer of the first electrode for hole injection or hole extraction. Therefore, the n-type organic compound layer of the first electrode and the p-type organic compound layer form the NP junction. FIG. 2 shows the NP junction formed between the n-type organic compound layer of the first electrode and the p-type organic compound layer.

When the NP junction is formed, the energy level difference between the LUMO energy level of the n-type organic compound layer of the first electrode and the HOMO energy level of the p-type organic compound layer is reduced. Therefore, holes or electrons are easily generated by an external voltage or a light source. The NP junction causes holes and electrons to be easily generated in the p-type organic compound layer and the n-type organic compound layer of the first electrode, respectively. Since holes and electrons are simultaneously generated in the NP junction, the electrons are transported to the conductive layer of the first electrode through the n-type organic compound layer of the first electrode and holes are transported to the p-type organic compound layer.

Examples of the electronic device according to the exemplary embodiment of the invention include an organic light emitting device, an organic solar cell, and an organic transistor, but are not intended to limit the present invention.

Organic Light Emitting Device

An organic light emitting device includes an anode electrode including a conductive layer and an n-type organic compound layer positioned on the conductive layer; a cathode electrode; and a p-type organic compound layer interposed between the n-type organic compound layer and the cathode to form an NP-junction together with the n-type organic compound layer. The organic light emitting device may include at least one of a hole injection layer, a hole transport layer, an emitting layer, an electron transport layer, and an electron injection layer between the n-type organic compound layer of the anode and the cathode.

FIGS. 3 to 5 illustrate organic light emitting devices according to exemplary embodiments of the invention. Referring to FIGS. 3 to 5, organic light emitting devices according to first to third embodiments of the invention are formed as follows.

First Embodiment substrate 31
anode 32: conductive layer 32a/n-type organic compound layer 32b
p-type hole injection layer 33
hole transport layer 34
emitting layer 35
electron transport layer 36
cathode 37

Second Embodiment substrate 31
anode 32: conductive layer 32a/n-type organic compound layer 32b
p-type hole injection layer 34
emitting layer 35
electron transport layer 36
cathode 37

Third Embodiment substrate 31
anode 32: conductive layer 32a/n-type organic compound layer 32b
p-type emitting layer 35
electron transport layer 36
cathode 37

In the first to third embodiments, the hole transport layer 34, the emitting layer 35, and the electron transport layer 36 may be formed of the same organic compound or different organic compounds. In the second embodiment, the n-type organic compound layer 32b functions as a hole injection layer as well. In the third embodiment, the n-type organic compound layer 32b functions as both a hole injection layer and a hole transport layer.

In the first to third embodiments, an energy difference between an LUMO energy level of the n-type organic compound layer 32b and the Fermi energy level of the conductive layer 32a is more than 2 eV and equal to or less than 4 eV. In the first to third embodiments, the p-type organic compound layer forming the NP junction together with the n-type organic compound layer 32b is the p-type hole injection layer 33, the p-type hole transport layer 34, and the p-type emitting layer 35, respectively. As for the n-type organic compound layer 32b and the p-type organic compound layer forming the NP junction, the energy difference between an LUMO energy level of the n-type organic compound layer 32b and an HOMO energy level of the p-type organic compound layer is approximately 1 eV or less, and preferably, approximately 0.5 eV or less.

When the energy difference between the LUMO energy level of the n-type organic compound layer 32b and the Fermi energy level of the conductive layer 32a is lager than 4 eV, a surface dipole or gap state effect on an energy barrier for injection of the holes into the p-type hole injection layer is reduced. When the energy difference between the LUMO energy level of the n-type organic compound layer 32b and the HOMO energy level of the p-type hole injection layer is lager than approximately 1 eV, holes or electrons are not easily generated in the p-type organic compound layer or the n-type organic compound layer 32b, respectively, and a driving voltage for injection holes increases.

FIG. 6 illustrates an ideal energy level of an organic light emitting device according to the related art. At this energy level, a loss of energy for injecting holes and electrons from the anode and the cathode, respectively, is minimized. FIG. 7 illustrates an energy level of an organic light emitting device according to an exemplary embodiment of the invention.

Referring to FIG. 7, an organic light emitting device according to an exemplary embodiment of the invention includes an anode including a conductive layer and an n-type organic compound layer (see FIG. 3), a p-type hole injection layer HIL, a hole transport layer HTL, an emitting layer EML, an electron transport layer ETL, and a cathode. The energy difference between an LUMO energy level of the n-type organic compound layer of the anode and a Fermi energy level of the conductive layer of the anode is more than 2 eV and equal to or less than 4 eV. Further, the energy difference between the LUMO energy level of the n-type organic compound layer of the anode and an HOMO energy level of the p-type hole injection layer is approximately 1 eV or less. Since an energy barrier for injecting or extracting holes/electrons is lowered by the n-type organic compound layer of the anode, holes are easily transported from the anode to the emitting layer using the LUMO energy level of the n-type organic compound layer of the anode and the HOMO energy level of the p-type hole injection layer.

Since the n-type organic compound layer of the anode lowers the energy barrier for injecting holes from the anode to the p-type hole injection layer, the p-type hole transport layer, or the p-type emitting layer, the conductive layer of the anode may be formed of various conductive materials. For example, the conductive layer may be formed of a material having the same work function as the cathode, such as Ca, Ca—Ag, Ca-IZO, or Mg—Ag. When the anode is formed of the same material as the cathode, a stack-type organic light emitting device in which a conductive material has a low work function may be manufactured.

Since the cathode and the anode may be formed of the same material, a stack-type organic light emitting device having a structure, as shown in FIG. 10, in which at least two unit organic light emitting devices each including an anode 71, a cathode 75, and an organic compound layer 73 interposed therebetween are connected in series, and a stack-type organic light emitting device having a similar structure to the structure mentioned above, as shown in FIG. 11, can be manufactured. In this case, the anode 71 includes a conductive layer and an n-type organic compound layer.

Referring to FIG. 11, the stack-type organic light emitting device according to the exemplary embodiment of the invention is formed by stacking the cathode of a unit organic emitting device as the anode of another adjacent unit organic light emitting device. More specifically, the stack-type organic light emitting device has a structure in which a plurality of repetition units, each of which includes an organic compound layer 83 and a conductive interlayer 85 serving as the anode of a unit organic light emitting device and the cathode of an adjacent unit organic light emitting device, are stacked between an anode 81 and a cathode 87. In this stack-type organic light emitting device, the conductive interlayer 85 comprises a conductive layer and an n-type organic compound layer. The conductive layer is preferably formed of a transparent material having a work function close to that of the material of the cathode 87 and visible light transmittance of 50% or more. When the conductive layer is formed of a non-transparent metal, the conductive layer should be made thin so as to transmit light. Examples of the non-transparent metal include Al, Ag, Cu, Ca, Ca—Ag, and the like. Ca having a low work function may be used to form the conductive layer of the conductive interlayer 85. In particular, when Ca-IZO is used to form the conductive interlayer of the conductive interlayer 85, it is possible to improve visible light transmittance. Since luminance of the stack-type organic light emitting device increases in proportion to the number of stacked unit organic light emitting devices at the same driving voltage, when an organic light emitting device is formed in a stack type, it is possible to obtain a high-luminance organic light emitting device.

An organic light emitting device according to an exemplary embodiment of the invention is manufactured by depositing a metal or a conductive metal oxide or an alloy thereof on a substrate so as to form an anode, forming thereon an organic compound layer including a hole injection layer, a hole transport layer, an emitting layer, and an electron transport layer, and depositing thereon a material capable of being used as a cathode, using a PVD (Physical Vapor Deposition) method, such as a sputtering method or an e-beam evaporation method. Also, an organic light emitting device according to an exemplary embodiment of the invention may be manufactured by sequentially depositing a cathode material, an organic compound layer, and an anode material on a substrate (see International Patent Application No. 2003/012890).

The organic compound layer may have a multi-layer structure including the hole injection layer, the hole transport layer, the emitting layer, and the electron transport layer, but is not intended to limit the present invention. The organic compound layer may have a single-layer structure. Further, the organic compound layer may be formed by a solvent process, using various high-molecular-weight materials, such as spin coating, dip coating, doctor blading, screen printing, inkjet printing, and thermal transfer techniques, so as to have a smaller number of layers.

Hereinafter, individual layers constituting an organic light emitting device according to an exemplary embodiment of the invention will be described in detail. The material of each of the layers that will be described below may be a single material or a compound of at least two materials.

Anode

An anode injects holes into a p-type organic compound layer, such as a hole injection layer, a hole transport layer, or an emitting layer. The anode includes a conductive layer and an n-type organic compound layer. The conductive layer contains a metal, a metal oxide, or a conductive polymer. The conductive polymer may include an electro-conductive polymer.

Since the n-type organic compound layer lowers the energy barrier for injecting holes to a p-type organic compound layer, the conductive layer may be formed of various conductive materials. For example, the conductive layer has a Fermi energy level within a range of approximately 2.5 eV to 5.5 eV. Examples of the conductive material include carbon, aluminum, calcium, vanadium, chromium, copper, zinc, silver, gold, other metals, and an alloy thereof; zinc oxides, indium oxides, tin oxides, indium tin oxides (ITO), indium zinc oxides (IZO), and metal oxides that are similar thereto; and Ca—Ag or materials having a stacked structure of a metal and a metal oxide such as Ca-IZO. When an organic light emitting device of a normal structure including an anode as a lower electrode is a top emission type, the conductive layer may be formed of not only a transparent material but also a non-transparent material having high reflectance. When an organic light emitting device of the normal structure including the anode as a lower electrode is a bottom emission type, the conductive layer should be formed of a transparent material. If the conductive layer is formed of a non-transparent material, the conductive layer should be made thin so as to transmit light. This is conversely applied to an organic light emitting device of an inverted structure including an anode as an upper electrode.

The n-type organic compound layer is interposed between the conductive layer and the p-type organic compound layer and injects holes into the p-type organic compound layer at a low electric field. The n-type organic compound layer is selected such that the energy difference between an LUMO energy level of the n-type organic compound layer of the anode and a Fermi energy level of the conductive layer of the anode is more than 2 eV and equal to or less than 4 eV and the energy difference between the LUMO energy level of the n-type organic compound layer and an HOMO energy level of the p-type organic compound layer is approximately 1 eV or less. For example, the n-type organic compound layer has an LUMO energy level in a range of approximately 4 eV to 7 eV and electron mobility in a range of approximately $10^{-8}$ cm$^2$/Vs to 1 cm$^2$/Vs, preferably, approximately $10^{-6}$ cm$^2$/Vs to $10^{-2}$ cm$^2$/Vs. When the electron mobility is less than approximately $10^{-8}$ cm$^2$/Vs, it is not easy for the n-type organic compound layer to inject holes into the p-type organic compound layer.

The n-type organic compound layer may be formed of a material capable of being vacuum-deposited or a material capable of being formed into a thin film by a solution process. Examples of the material of the n-type organic compound layer are not limited thereto and include the above-mentioned materials.

Hole Injection Layer (HLT) or Hole Transport Layer (HTL)

The hole injection layer or the hole transport layer is a p-type organic compound layer interposed between the anode and the cathode and forms an NP junction together with the n-type organic compound layer formed on the conductive layer of the anode. Holes generated in the NP junction are transported to the emitting layer through the p-type hole injection layer or the p-type hole transport layer.

The energy difference between an HOMO energy level of the p-type hole injection layer or the p-type hole transport layer forming the NP junction and an LUMO energy level of the n-type organic compound layer is approximately 1 eV or less, and preferably, approximately 0.5 eV or less. Examples of the material of the p-type hole injection layer or the p-type hole transport layer include arylamine-based compounds, conductive polymers, or block copolymers having both a conjugated portion and an unconjugated portion, but are not intended to limit the present invention.

Emitting Layer (EML)

In the emitting layer, hole transport and electron transport occur at the same time. Therefore, the emitting layer may have both of n-type characteristics and p-type characteristics. For convenience, the emitting layer may be defined as the n-type emitting layer when the electron transport is rapider than the hole transport, and also defined as the p-type emitting layer when the hole transport is rapider than the electron transport.

In the n-type emitting layer, since the electron transport is rapider than the hole transport, light emission occurs in the vicinity of the interface between the hole transport layer and the emitting layer. Therefore, when an LUMO energy level of the hole transport layer is higher than an LUMO energy level of the emitting layer, higher light emission efficiency can exhibit. Examples of the material of the n-type emitting layer include aluminum tris(8-hydroxyquinoline) (Alq3); 8-hydroxyquinoline beryllium (BAlq); a benzoxazole-based compound, a benzthiazol-based compound or a benzimidazole-based compound; a polyfluorene-based compound; and a silacyclopentadiene (silole)-based compound, but are not intended to limit the present invention.

In the p-type emitting layer, since the hole transport is rapider than the electron transport, light emission occurs in the vicinity of the interface between the electron transport layer and the emitting layer. Therefore, when an HOMO energy level of the electron transport layer is lower than an HOMO energy level of the emitting layer, higher light emission efficiency can exhibit. In a case of using the p-type emitting layer, an increase effect depending on a variation in the LUMO energy level of the hole transport layer on the light emission efficiency is smaller compared with a case of using the n-type emitting layer. Therefore, in a case of using the p-type emitting layer, an organic light emitting device having an NP junction of an n-type organic compound layer and a p-type organic compound layer can be manufactured without using the hole injection layer and the hole transport layer. Examples of the material of the p-type emitting layer include carbazole-based compounds, anthracene-based compounds, polyphenylenevinylene (PPV)-based polymers, or spiro compounds, but are not intended to limit the present invention.

Electron Transport Layer (ETL)

The material of the electron transport layer is preferably a material having high electron mobility to effectively receive electrons from the cathode and transport the electrons to the emitting layer. Examples of the material of the electron transport layer include aluminum tris(8-hydroxyquinoline) (Alq3), an organic compound containing an Alq3 structure, or a hydroxy flavone-metal complex compound or a silacyclopentadiene (silole)-based compound, but are not intended to limit the present invention.

Cathode

The material of the cathode is preferably a material having a low work function to easily inject electrons to the LUMO energy level of the n-type organic compound layer such as the electron transport layer. Examples of the material of the cathode include a metal, such as magnesium, calcium, sodium, potassium, titanium, indium, yttrium, lithium, gadolinium, aluminum, silver, tin, and lead, or an alloy thereof; and materials having a multi-layer structure, such as LiF/Al or $LiO_2$/Al. Alternatively, the cathode may be formed of the same material as the conductive layer of the anode. The cathode or the conductive layer of the anode may contain a transparent material.

Organic Solar Cell

An organic solar cell includes an anode, a cathode, and a thin organic compound layer interposed between the anode and the cathode. The thin organic compound layer includes a plurality of layers to improve the efficiency and stability of the organic solar cell. Referring to FIG. 8, an organic solar cell according to an exemplary embodiment of the invention may be formed as follows.

substrate 41
anode 42: conductive layer 42a/n-type organic compound layer 42b
electron donor layer 43
electron acceptor layer 44
cathode 45

When the organic solar cell receives photons from an external light source, electrons and holes are generated between the electron donor layer 43 and the electron acceptor 44 and the generated holes are transported to the anode 42 through the electron donor layer 43. The electron donor layer 43 is formed of a p-type organic compound layer so as to form an NP junction together with the n-type organic compound layer of the anode. The p-type organic compound layer may be formed of a compound of at least two materials. An organic solar cell according to another exemplary embodiment of the invention may further include an additional thin organic compound layer or exclude a specific organic compound layer to simplify the manufacturing process. When an organic compound having various functions is used, it is possible to reduce the number of organic compound layers of the organic solar cell.

A conventional organic solar cell according transports holes to an anode along an HOMO energy level of an thin organic compound layer, such as an electron donor layer. Therefore, as the energy level difference between a Fermi energy level of the anode and an HOMO energy level of an electron donor layer decreases, more holes are extracted. However, in the organic solar cell according to the exemplary embodiment of the invention, since an NP junction is formed by the n-type organic compound layer 42b of the anode and the electron donor layer 43, holes are extracted efficiently and extracted holes are injected to the conductive layer 42a through an LUMO energy level of the n-type organic compound layer 42b.

The energy difference between an LUMO energy level of the n-type organic compound layer 42b of the anode and a Fermi energy level of the conductive layer 42a of the anode is more than 2 eV and equal to or less than 4 eV, and the energy difference between the LUMO energy level of the n-type organic compound layer 42b and an HOMO energy level of a p-type organic compound layer, such as the electron donor layer 43, is approximately 1 eV or less. Examples of the material of the conductive layer 42a may include various materials each having different Fermi energy level. The cathode 45 and the anode 42 may be formed of the same material.

In the organic solar cell, the conductive layer 42a of the anode and the cathode 45 may be formed using the materials exemplified as the materials of the conductive layer of the anode and the cathode of the organic light emitting device. Further, the n-type organic compound layer of the organic solar cell nay be formed using the materials exemplified as the material of the n-type organic compound layer of the organic light emitting device. In the organic solar cell, the electron acceptor 44 may be formed of the materials exemplified as the material of the electron transport layer or the n-type emitting layer of the organic light emitting device or materials known as fullerene-based compounds. The electron donor layer 43 of the organic solar cell may be formed of the materials exemplified as the material of the p-type hole transport layer or the p-type emitting layer of the organic light emitting device or thiophene-based polymers.

Organic Transistor

FIG. 9 illustrates an organic transistor according to an exemplary embodiment of the invention.

Referring to FIG. 9, an organic transistor includes a substrate 61, a source electrode 65, a drain electrode 66, a gate electrode 62, an insulating layer 63 disposed on the substrate 61 and the gate electrode 62, and a p-type organic compound layer 64 that is disposed on the insulating layer 63 and generates holes. At least one of the source electrode 65 and the drain electrode 66 includes a conductive layer 65a, 66a and an n-type organic compound layer 67 forming an NP junction together with the p-type organic compound layer 64. The energy difference between an LUMO energy level of the n-type organic compound layer 67 of the source electrode 65 or the drain electrode 66 and a Fermi energy level of the conductive layer 65a, 66a is more than 2 eV and equal to or less than 4 eV. The energy difference between the LUMO energy level of the n-type organic compound layer 67 of the source electrode 65 or the drain electrode 66 and an HOMO energy level of the p-type organic compound layer 64 is approximately 1 eV or less.

The n-type organic compound layer 67 of the source electrode 65 or the drain electrode 66 may extract holes from the conductive layer 65a, 66a of the source electrode 65 and inject the holes to the drain electrode 66 through the LUMO energy level. Since the NP junction is formed between the p-type organic compound layer 64 and the n-type organic compound layer 67 of the source electrode 65 or the drain electrode 66, the holes can be smoothly transported between the source electrode 65 and the drain electrode 66. In the invention, since the n-type organic compound layer 67 forms a portion of the source electrode 65 or the drain electrode 66, the conductive layers 65a, 66a of the source electrode 65 or the drain electrode 66 may be formed using various material having different Fermi energy levels.

In the organic transistor according to the exemplary embodiment of the invention, the n-type organic compound layer 67 of the source electrode 65 or the drain electrode 66 may be formed using the materials exemplified as the material of the n-type organic compound layer of the organic light emitting device. The gate electrode 62 may be formed using the materials exemplified as the material of the anode or the cathode of the organic light emitting device.

The conductive layer 65a, 66a of the source electrode 65 or the drain electrode 66 may be formed using the materials exemplified as the material of the anode of the organic light emitting device. The p-type organic compound layer 64 may be formed using pentacene-based compounds, antradithiophene-based compounds, benzodithiophene-based compounds, thiophene-based oligomers, polythiophenes, mixed-subunitthiophene oligomers, oxy-funcionalized thiophene oligomers, or the like. The insulating layer 63 may be formed of silicon oxide, silicon nitride; or a polymer such as polyimide, poly(2-vinylpyridine), poly(4-vinylphenol) or poly(methylmethacrylate).

MODE FOR INVENTION

Hereinafter, various aspects and features of the invention will be described in detail by way of examples. However, the following examples are just illustrative examples for describing various aspects and features of the invention and the scope of the invention is not limited to the following examples.

EXAMPLES

HOMO and LUMO energy levels of hexanitrile hexaazatriphenylene by UPS and UV-VIS absorption method (See Formula 1-1, HAT, Korea Patent Publication No. 2003-67773) were measured by a method disclosed in PCT/KR2005/001381. The HOMO energy level of HAT is 9.78 eV and the LUMO energy level of HAT is 6.54 eV. These levels can be changed by exciton binding energy of HAT. 6.54 eV is higher than the Fermi energy level of HAT, that is, 6.02 eV. In order to make the LUMO energy level lower than Fermi energy level, the exciton binding energy should be equal to or more than 0.52 eV. Since exciton binding energy of an organic compound is generally in a range of 0.5 eV to 1 eV, the LUMO energy level of HAT is estimated to 5.54 eV to 6.02 eV.

A glass substrate (Corning 7059 glass) was immersed in distilled water containing a detergent (Product No. 15-335-55 made by Fischer Co.) to wash the substrate with ultrasonic waves for 30 minutes. Next, washing with ultrasonic waves for 5 minutes was repeated twice by using distilled water. After the completion of washing with distilled water, washing with ultrasonic waves was carried out by using isopropyl alcohol, acetone and methanol in this order. The resultant product was dried to be used.

Example 1

Organic Light Emitting Device Including Anode Having IZO-Ca Conductive Layer and HAT n-Type Organic Compound Layer IZO was vacuum-deposited on a washed glass substrate to have a thickness of 1000 Å using a sputtering deposition apparatus and Ca was thermally vacuum-deposited thereon to have a thickness of 100 Å. As a result, a transparent IZO-Ca conductive layer having a work function of 2.6 eV was formed. Then, HAT was thermally vacuum-deposited on the formed conductive layer to have a thickness of approximately 500 Å. As a result, a transparent anode having the IZO-Ca conductive layer and the HAT n-type organic compound layer was formed. Subsequently, 4,4'-bis[N-(1-naphthyl)-N-phenylamino]biphenyl (NPB) was vacuum-deposited on the anode to have a thickness of approximately 400 Å so as to form a p-type hole transport layer. Next, Alq3 having an HOMO energy level of approximately 5.7 eV was vacuum-deposited on the p-type hole transport layer to have a thickness of approximately 300 Å so as to form an emitting layer. Then, the following compound (the HOMO energy level is approximately 5.7 eV) was vacuum-deposited on the emitting layer to have a thickness of 200 Å so as to form an electron transport layer.

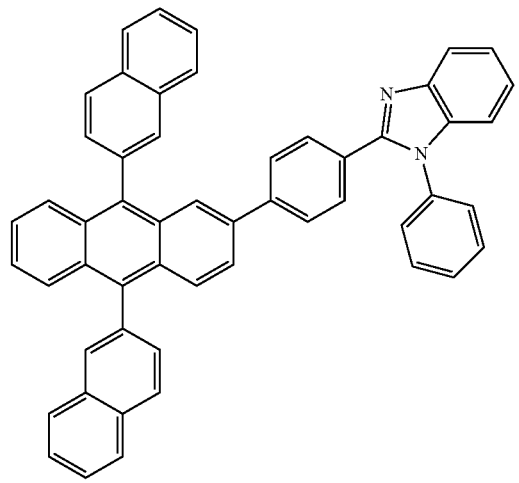

Finally, lithium fluoride (LiF) was vacuum-deposited on the electron transport layer to have a thickness of 12 Å and then aluminum (Al) was vacuum-deposited thereon to have a thickness of 2500 Å so as to form a cathode. In such a manner, an organic light emitting device was completed. In the processes of manufacturing the organic light emitting device, the organic compound depositing speed was maintained at approximately 0.4 to 0.7 Å/sec, the LiF depositing speed was maintained at approximately 0.3 Å/sec, and the Ca or Al depositing speed was maintained at approximately 2 Å/sec. During deposition, the degree of vacuum in a deposition chamber was maintained at approximately $2 \times 10^{-7}$ to $5 \times 10^{-8}$ torr.

Example 2

Organic Light Emitting Device Including Anode Having Ag—Ca Conductive Layer and HAT n-Type Organic Compound Layer An organic light emitting device was manufactured by the same method as Example 1, except that Ag was thermally vacuum-deposited on a washed glass substrate to have a thickness of 200 Å and Ca was thermally vacuum-deposited thereon to have a thickness of 200 Å so as to form a semitransparent Ag—Ca conductive layer having a work function of 2.6 eV, instead of the transparent IZO-Ca conductive layer.

TABLE 1

| | | | @50 mA/cm² | | @100 mA/cm² | |
|---|---|---|---|---|---|---|
| | Anode | Work function of anode | Voltage (V) | Luminance (cd/sq) | Voltage (V) | Luminance (cd/sq) |
| Example 1 | IZO (1000 Å)-Ca (100 Å) | 2.6 eV | 5.10 | 1300 | 6.30 | 2663 |
| Example 2 | Ag (200 Å)-Ca (200 Å) | 2.6 eV | 4.20 | 500 | 4.80 | 1000 |

From Table 1 representing the luminance of Examples 1 and 2 depending on a current density and a voltage, it can be seen that holes are smoothly injected to the hole transport layer even though the energy difference between the LUMO energy level (approximately 5.54 eV to 6.02 eV) of the n-type organic compound layer (HAT) and the Fermi energy level (2.6 eV) of the conductive layer is 2.9 eV to 3.4 eV. This means that, in a range in which the energy difference between the LUMO energy level of the n-type organic compound layer and the Fermi energy level of the conductive layer is more than 2 eV and equal to or less than 4 eV, the current-voltage characteristic of the organic light emitting device is independent of the Fermi energy level of the conductive layer.

The luminance of the organic light emitting device according to Example 2 is lower than the luminance of the organic light emitting device according to Example 1. This is because the visible light transmittance of the Ag (200 Å)-Ca (200 Å) conductive layer is lower than IZO (1000 Å)-Ca (100 Å). Considering the visible light transmittance, it is determined that the luminance of the organic light emitting device according to Example 2 is equivalent to the luminance of a device having the conductive layer of Example 1.

The above-mentioned results of Table 1 represent that it is possible to use, as an anode of an organic light emitting device, an electrode that includes a conductive layer formed of a material having a low Fermi energy level, such as Ca, to be used as a cathode electrode; an n-type organic compound layer, in which a difference between an LUMO energy level of the n-type organic compound layer and a Fermi energy level of the conductive layer is more than 2 eV and equal to or less than 4 eV; and a p-type organic compound layer that forms an NP junction together with the n-type organic compound layer, in which a difference between an HOMO energy level of the p-type organic compound layer and the LUMO energy level of the n-type organic compound layer is 1 eV or less. This means that it is possible to form the conductive layer of the anode and the cathode of the same material, and to realize a stack-type organic light emitting device shown in FIG. 11 in which a conductive layer of an anode and a cathode are formed of the same material.

The invention claimed is:

1. An electronic device, comprising:
a first electrode to inject or extract holes, the first electrode including a conductive layer and an n-type organic compound layer disposed on the conductive layer;
a second electrode to inject or extract electrons; and
a p-type organic compound layer that is interposed between the n-type organic compound layer of the first electrode and the second electrode and forms an NP junction together with the n-type organic compound layer of the first electrode,
wherein energy levels of the layers satisfy the following Expressions (1) and (2):

$$2\ eV < EnL - EF1 \leq 4\ eV \quad (1)$$

$$EpH - EnL \leq 1\ eV \quad (2)$$

where EF1 is a Fermi energy level of the conductive layer of the first electrode, EnL is an LUMO energy level of the n-type organic compound layer of the first electrode, and EpH is an HOMO energy level of the p-type organic compound layer forming the NP junction together with the n-type organic compound layer of the first electrode, and the conductive layer of the first electrode, and the conductive layer of the first electrode is formed of a material selected from a group consisting of calcium, Ca—Ag; Ca-IZO; and Mg—Ag.

2. The electronic device as set forth in claim 1, further comprising:
at least one organic compound layer disposed between the p-type organic compound layer and the second electrode.

3. The electronic device as set forth in claim 1, wherein the n-type organic compound layer of the first electrode contains a compound represented by the following Formula 1:

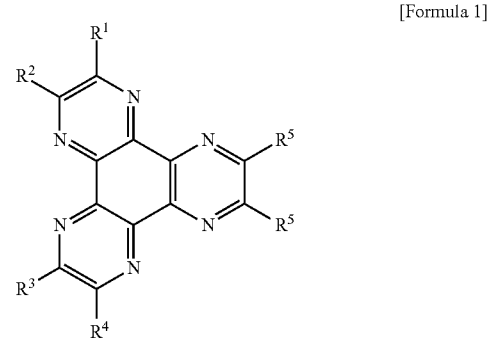

[Formula 1]

where each of $R^1$ to $R^6$ is selected from a group consisting of hydrogen, halogen atoms, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight or branched chain $C_1$-$C_{12}$ alkoxy, substituted or unsubstituted straight or branched $C_1$-$C_{12}$ alkyl, substituted or unsubstituted aromatic or non-aromatic heterocyclic rings, substituted or unsubstituted aryl, substituted or unsubstituted mono- or di-arylamine, and substituted or unsubstituted aralkylamine, and each of R and R' are selected from a group consisting of substituted or unsubstituted $C_1$-$C_{60}$ alkyl, substituted or unsubstituted aryl, and substituted or unsubstituted 5-7 membered heterocyclic rings.

4. The electronic device as set forth in claim 3, wherein the compound of Formula 1 is selected from compounds represented by the following Formulae 1-1 to 1-6:

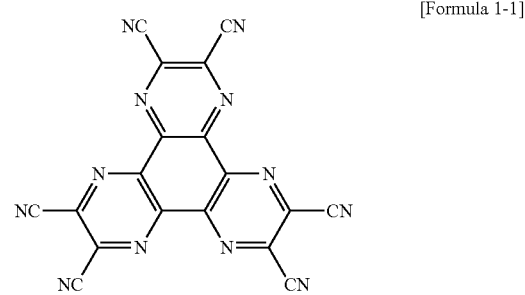

[Formula 1-1]

-continued

[Formula 1-2]

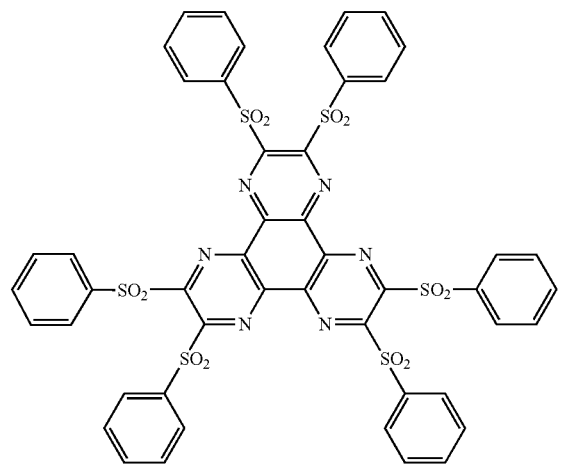

[Formula 1-3]

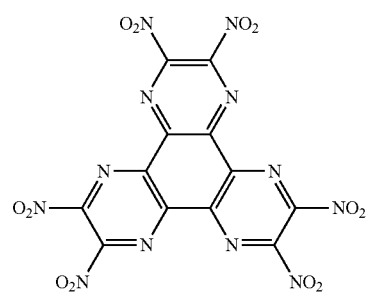

[Formula 1-4]

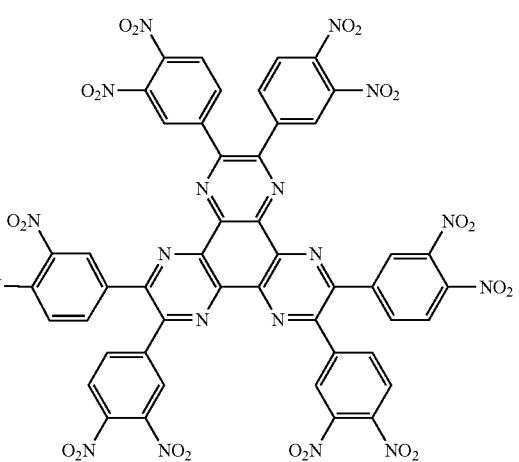

-continued

[Formula 1-5]

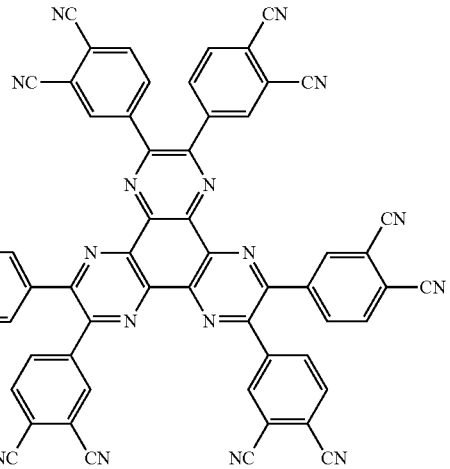

[Formula 1-6]

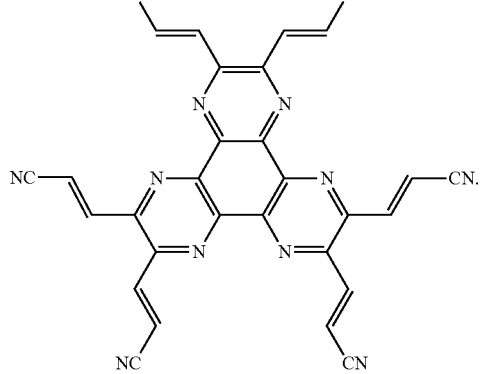
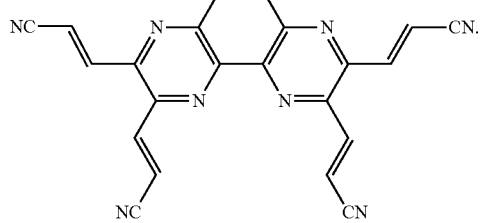

5. The electronic device as set forth in claim 1, wherein the n-type organic compound layer of the first electrode contains 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted 3,4,9,10-perylenetetracarboxylic dianhydride (PTCDA), naphthalene-tetracarboxylic-dianhydride (NTCDA), fluoro-substituted naphthalene-tetracarboxylic-dianhydride (NTCDA), or cyano-substituted naphthalene-tetracarboxylic-dianhydride (NTCDA).

6. The electronic device as set forth in claim 1, wherein the conductive layer of the first electrode and the second electrode are formed of the same material.

7. The electronic device as set forth in claim 1, wherein the conductive layer of the first electrode and the second electrode are formed of a material selected from a group consisting of Ca, Ca—Ag, Ca-IZO, and Mg—Ag.

8. The electronic device as set forth in claim 1, wherein the electronic device is an organic light emitting device that includes:
   an anode including a conductive layer and an n-type organic compound layer disposed on the conductive layer;
   a cathode; and
   a p-type organic compound layer that is interposed between the n-type organic compound layer of the anode and the cathode and forms an NP junction together with the n-type organic compound layer of the anode, wherein energy levels of the layers satisfy the following Expressions (3) and (4):

$$2\ eV < E_{nL} - E_{F1} \leq 4\ eV \quad (3)$$

$$E_{pH} - E_{nL} \leq 1\ eV \quad (4)$$

where $E_{F1}$ is a Fermi energy level of the conductive layer of the anode, $E_{nL}$ is an LUMO energy level of the n-type organic compound layer of the anode, and $E_{pH}$ is an HOMO energy level of the p-type organic compound layer forming the NP junction together with the n-type organic compound layer of the anode.

9. The electronic device as set forth in claim 8, further comprising:
at least one selected from a hole injection layer, a hole transport layer, an emitting layer, an electron transport layer, and an electron injection layer, which is disposed between the p-type organic compound layer and the cathode.

10. The electronic device as set forth in claim 8, wherein the conductive layer of the anode and the cathode are formed of the same material.

11. The electronic device as set forth in claim 8, wherein the conductive layer of the anode and the cathode are formed of a material selected from a group consisting of Ca, Ca—Ag, Ag-IZO, and Ma-Ag.

12. The electronic device as set forth in claim 8, wherein the n-type organic compound layer of the anode has an LUMO energy level of 4 to 7 eV and electron mobility of $10^{-8}$ cm$^2$/Vs to 1 cm$^2$/Vs.

13. The electronic device as set forth in claim 8, wherein the n-type organic compound layer of the anode contains a compound represented by the following Formula 1:

[Formula 1]

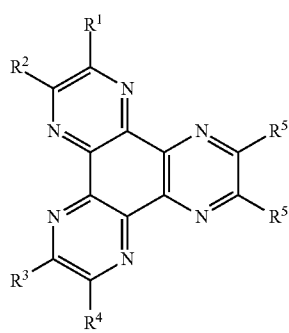

where each of $R^1$ to $R^6$ is selected from a group consisting of hydrogen, halogen atoms, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight or branched chain C$_1$-C$_{12}$ alkoxy, substituted or unsubstituted straight or branched C$_1$-C$_{12}$ alkyl, substituted or unsubstituted aromatic or non-aromatic heterocyclic rings, substituted or unsubstituted aryl, substituted or unsubstituted mono- or di-arylamine, and substituted or unsubstituted aralkylamine, and each of R and R' are selected from a group consisting of substituted or unsubstituted C$_1$-C$_{60}$ alkyl, substituted or unsubstituted aryl, and substituted or unsubstituted 5-7 membered heterocyclic rings.

14. The electronic device as set forth in claim 13, wherein the compound of Formula 1 is selected from compounds represented by the following Formulae 1-1 to 1-6:

[Formula 1-1]

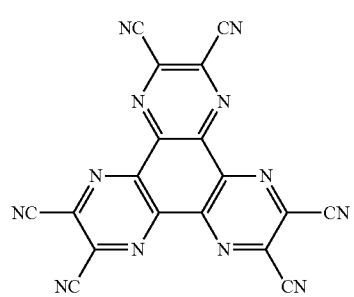

[Formula 1-2]

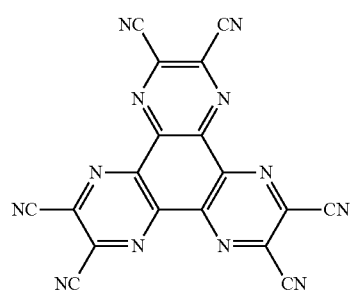

[Formula 1-3]

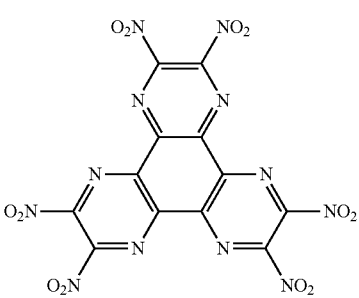

[Formula 1-4]

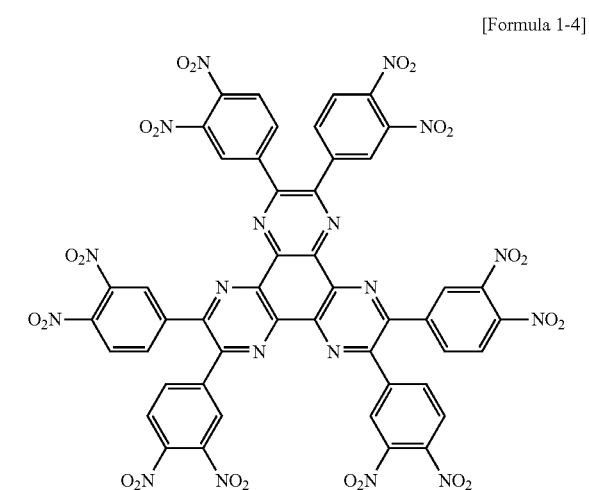

[Formula 1-5]

[Formula 1-6]

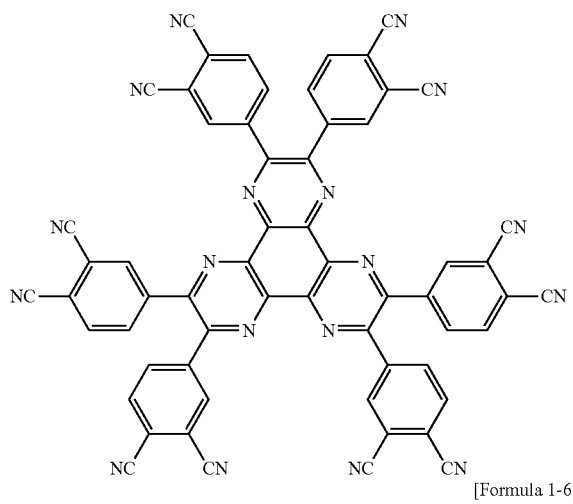

15. The electronic device as set forth in claim 8, wherein the n-type organic compound layer of the anode contains 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted 3,4,9,10-perylenetetracarboxylic dianhydride (PTCDA), naphthalene-tetracarboxylic-dianhydride (NTCDA), fluoro-substituted naphthalene-tetracarboxylic-dianhydride (NTCDA), or cyano-substituted naphthalene-tetracarboxylic-dianhydride (NTCDA).

16. A stack-type organic light emitting device comprising at least two electronic device as set forth in claim 8, wherein an anode of one electronic device is connected to a cathode of an adjacent electronic device in series.

17. The stack-type organic light emitting device as set forth in claim 16, wherein the conductive layer of the anode and the cathode of the electronic device are formed of the same material.

18. The stack-type organic light emitting device as set forth in claim 17, in the anode and the cathode deposed in the interface between the electronic devices connected in series, the conductive layer of the anode and the cathode form a single conductive layer.

19. The electronic device as set forth in claim 1, wherein the electronic device is an organic solar cell that includes:
   an anode including a conductive layer and an n-type organic compound layer disposed on the conductive layer;
   a cathode; and
   an electron donor layer consisting of a p-type organic compound layer that is interposed between the n-type organic compound layer of the anode and the cathode and forms an NP junction together with the n-type organic compound layer of the anode,
   wherein energy levels of the layers satisfy the following Expressions (5) and (6):

$$2\ eV < E_{nL} - E_{F1} \leq 4\ eV \tag{5}$$

$$E_{pH} - E_{F1} \leq 1\ eV \tag{6}$$

where $E_{F1}$ is a Fermi energy level of the conductive layer of the anode, $E_{nL}$ is an LUMO energy level of the n-type organic compound layer of the anode, and $E_{pH}$ is an HOMO energy level of the p-type organic compound layer forming the NP junction together with the n-type organic compound layer of the anode.

20. The electronic device as set forth in claim 19, further comprising:
   an electron acceptor layer disposed between the cathode and the electron donor layer.

21. The electronic device as set forth in claim 19, wherein the conductive layer of the anode and the cathode are formed of the same material.

22. The electronic device as set forth in claim 19, wherein the n-type organic compound layer of the anode contains 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted 3,4,9,10-perylenetetracarboxylic dianhydride (PTCDA), naphthalene-tetracarboxylic-dianhydride (NTCDA), fluoro-substituted naphthalene-tetracarboxylic-dianhydride (NTCDA), cyano-substituted naphthalene-tetracarboxylic-dianhydride (NTCDA), or hexanitrile hexaazatriphenylene (HAT).

23. The electronic device as set forth in claim 1, wherein the electronic device is an organic transistor that includes:
   a source electrode;
   a drain electrode;
   a gate electrode;
   an insulating layer disposed on the gate electrode; and
   a p-type organic compound layer disposed on the insulating layer, and
   at least one of the source electrode and the drain electrode includes a conductive layer and an n-type organic compound layer forming an NP junction together with the p-type organic compound layer,
   wherein energy levels of the layers satisfy the following Expressions (7) and (8):

$$2\ eV < E_{nL} - E_{F1} \leq 4\ eV \tag{7}$$

$$E_{pH} - E_{nL} \leq 1\ eV \tag{8}$$

where $E_{F1}$ is a Fermi energy level of the conductive layer of the source electrode or drain electrode, $E_{nL}$ is an LUMO energy level of the n-type organic compound layer of the source electrode or drain electrode, and $E_{pH}$ is an HOMO energy level of the p-type organic compound layer forming the NP junction together with the n-type organic compound layer of the source electrode or drain electrode.

24. The electronic device as set forth in claim 23, wherein the n-type organic compound layer contains 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted 3,4,9,10-perylenetetracarboxylic dianhydride (PTCDA), naphthalene-tetracarboxylic-dianhydride (NTCDA), fluoro-substituted naphthalene-tetracarboxylic-dianhydride (NTCDA), cyano-substituted naphthalene-tetracarboxylic-dianhydride (NTCDA), or hexanitrile hexaazatriphenylene (HAT).

* * * * *